United States Patent
Weng

Patent Number: 5,771,246
Date of Patent: Jun. 23, 1998

[54] MULTIPLE-BURST-CORRECTION SYSTEM

[75] Inventor: Lih-Jyh Weng, Needham, Mass.

[73] Assignee: Quantum Corporation, Milpitas, Calif.

[21] Appl. No.: 714,937

[22] Filed: Sep. 17, 1996

[51] Int. Cl.$^6$ .................................................. H03M 13/00
[52] U.S. Cl. .................. 371/39.1; 371/37.08; 371/37.11
[58] Field of Search .............................. 371/39.1, 37.08, 371/37.11

[56] References Cited

U.S. PATENT DOCUMENTS

| | | | |
|---|---|---|---|
| 4,868,828 | 9/1989 | Shao et al. | 371/5.1 |
| 4,916,702 | 4/1990 | Berlekamp | 371/39.1 |
| 5,107,506 | 4/1992 | Weng et al. | 371/39.1 |
| 5,631,909 | 5/1997 | Weng et al. | 371/5.1 |

*Primary Examiner*—Stephen M. Baker
*Attorney, Agent, or Firm*—Patricia A. Sheehan; David B. Harrison; Debra A. Chun

[57] ABSTRACT

A multiple-solid-burst error correcting system determines the number and locations of "solid burst" errors in a high-rate Reed Solomon or BCH code by determining the greatest common divisor of the error locator polynomial $\sigma(x)$, which has roots $\alpha^{-i_k}$ that correspond to error locations $i_k$, and a mapping error locator polynomial $\sigma(\alpha^* x)$ that maps the error locations, $i_k$, to locations $i_{k+1}$. The roots that are common to both polynomials, that is, the roots that are included in the greatest common divisor, $d(x)$, correspond to adjacent error locations that are contained in the solid bursts. The roots of the non-common factors, $p_1(x)$, of the error locator polynomial correspond to the first locations of the respective solid bursts and the roots of the non-common factors $p_2(x)$ of the mapping error locator polynomial correspond to one location beyond the end locations of the solid bursts. The system determines the roots of only the non-common factors to determine the locations that are included in the solid bursts. The system then labels all locations between associated first and last locations as part of a solid burst. If the error locator polynomial has degree "e" and the greatest common divisor has degree "d", the polynomials $p_1(x)$ and $p_2(x)$ each have degree e−d=p, which is equal to the number of solid bursts. The system finds the roots of the lower-degree $p_1(x)$, and uses $p_2(x)$ to test for the end locations of the bursts.

9 Claims, 6 Drawing Sheets

MULTIPLE-BURST-CORRECTION SYSTEM

FIELD OF THE INVENTION

This invention relates generally to data processing systems and, more particularly, to a system for decoding and correcting errors in data using an error correction code.

BACKGROUND OF THE INVENTION

Data stored on magnetic media, such as a magnetic disks, are typically stored in encoded form, so that errors in the stored data can possibly be corrected. The errors may occur, for example, because of inter-symbol interference, a defect in the disk, or noise. As the density of the data stored on the disk increases, more errors are likely, and the system is required to correct greater numbers of errors, which include greater numbers of burst errors. A burst error is typically defined as a contiguous number of symbols in which the first symbol and the last symbol are erroneous. The speed with which the system corrects the errors, including the burst errors, is important to the overall speed with which the system processes the data.

Prior to recording, multiple-bit data symbols are encoded using an error correction code (ECC). When the data symbols are retrieved from the disk and demodulated, the ECC is employed to, as the name implies, correct the erroneous data.

Specifically, before a string of k data symbols is written to a disk, it is mathematically encoded using an (n, k) ECC to form n-k ECC symbols. The ECC symbols are then appended to the data string to form an n-symbol error correction code word, which is then written to, or stored, on the disk. When the data are read from the disk, the code words containing the data symbols and ECC symbols are retrieved and mathematically decoded. During decoding, errors in the data are detected and, if possible, corrected through manipulation of the ECC symbols [for a detailed description of decoding see, Peterson and Weldon, *Error Correction Codes*, 2nd Ed. MIT Press, 1972].

To correct multiple errors in strings of data symbols, the system typically uses an ECC that efficiently and effectively utilizes the various mathematical properties of sets of symbols known as Galois fields. Galois fields are represented "GF (PM)", where "P" is a prime number and "M" can be thought of as the number of digits, base "P", in each element or symbol in the field. P usually has the value 2 in digital computer and disk drive applications and, therefore, M is the number of bits in each symbol. The ECC's commonly used with the Galois Fields are Reed Solomon codes or BCH codes.

There are essentially four major steps in decoding a corrupted code word of a high rate Reed-Solomon code or a BCH code. The system first determines error syndromes that are based on the results of a manipulation of the ECC symbols. Next, using the error syndromes, the system determines an error locator polynomial, which is a polynomial that has the same degree as the number of errors. The system then finds the roots of the error locator polynomial and from each root determines the location of an associated error in the code word. Finally, the system finds error values for the error locations.

The steps of determining the syndromes and finding the error locations are the most time consuming in the error correction process. This invention relates to the step of finding the error locations.

Codes are generally interleaved to provide maximum burst error protection. Otherwise, there are too many errors for the (non-interleaved) code to handle or it takes too long for the error correcting system to determine the error locations using the conventional trial and error method.

Interleaving segments the data string such that adjacent symbols are encoded by the ECC into different code words. Thus, the burst errors become independent errors spread out between the interleaved code words, and can be readily and quickly corrected.

Interleaving the codes, however, requires separately encoding each code segment and separately decoding each segment. Further, interleaving requires, for each interleaved code, extra ECC symbols for error detection. Alternatively, error detection could be performed using an error detection code that overlays the ECC, such as a parity check to guard against incorrect correction of the data. The interleaved codes must, however, correct the error detection symbols in order to ensure that the error detection code can perform its error detection function. The interleaved codes are thus either inefficient for requiring, for each interleaved code, ECC symbols for error detection or time consuming for requiring additional operations that are associated with an overlaid error detection code.

Another problem with interleaved codes is that the error correction fails if there are too many errors in one of the data segments, even if the other data segments are essentially error-free.

What is needed is a system that reduces the time it takes to determine the locations and lengths of burst errors using a non-interleaved code, such that the errors can be corrected in real time.

SUMMARY OF THE INVENTION

The invention is a multiple-solid-burst error correcting system for determining the number and locations of "solid burst" errors in a high-rate Reed Solomon or BCH code. A solid burst is one that includes a succession of erroneous symbols. This differs from the conventional definition of a burst error, which may include one or more non-erroneous symbols in between first and last erroneous symbols. Bursts that include non-erroneous symbols are treated as multiple solid bursts by the multiple-solid-burst error correcting system. An erroneous symbol that has only adjacent error-free symbols is a solid burst that consists of one symbol.

The system determines the greatest common divisor of the error locator polynomial $\sigma(x)$, which has roots $\alpha^{-i_k}$ that correspond to error locations $i_k$, and a mapping error locator polynomial $\sigma(\alpha^* x)$ that maps the error locations $i_k$, to locations $i_{k+}1$. The roots that are common to both the error locator polynomial and the mapping error locator polynomial, that is, the roots that are included in the greatest common divisor, $d(x)$, correspond to adjacent error locations that are contained in the solid bursts. The roots of the non-common factors, $p_1(x)$, of the error locator polynomial correspond to the first locations of the respective solid bursts and the roots of the non-common factors $p_2(x)$ of the mapping error locator polynomial correspond to one location beyond the end locations of the solid bursts. The system determines the roots of only the non-common factors to determine the locations that are included in the solid bursts. The system then labels all locations between associated first and last locations as part of a solid burst.

If the error locator polynomial has degree "e" and the greatest common divisor has degree "d", the polynomials $p_1(X)$ and $p_2(x)$ each have degree e−d=p. The system finds the roots of the lower-degree $p_1(x)$, and uses $p_2(x)$, to test for the end locations of the bursts. Accordingly, the system finds the roots of one degree-p polynomial rather than the roots of a degree-e polynomial, as is required by prior systems.

More specifically, the system determines the greatest common divisor of the error locator polynomial $$\sigma(x)=(\alpha^{i_0+1}*x+1)*(\alpha^{i_1}*x+1)*\ldots(\alpha^{i_{e-1}}*x+1) \quad [\text{eqn. 1}]$$

where "*" represents multiplication over $GF(2^M)$, and a mapping error locator polynomial $$\sigma(\alpha*x)=(\alpha^{i_0+1}*x+1)*(\alpha^{i_1+1}*x+1)*\ldots(\alpha^{i_{(e-1)}+1}*x+1) \quad [\text{eqn. 2}]$$

where the addition of exponents is modulo the code length n. The factors that are common to both polynomials are part of the greatest common divisor, and correspond to adjacent error locations that are part of the solid burst errors, as discussed above.

The factors that are included only in eqn. 1 correspond to error locations $i_k$ that are, respectively, the first error locations in the solid bursts. Further, the roots $\alpha^{-(i_j+1)}$ of the actors that are included only in eqn. 2 correspond respectively to error locations that are one location beyond the last locations of the solid bursts. These $i_{j+1}$ locations do not correspond to the roots of $\sigma(x)$, and thus, do not contain erroneous symbols.

The system uses a fast, iterative mechanism for determining the greatest common divisor, $d(x)$, of eqns. 1 and 2, as discussed below. Once the system determines the divisor, the system next determines the locations of the first and last symbols of the respective solid bursts by finding the roots of polynomial $p_1(x)$ where:

$$p_1(x) = \frac{\sigma(x)}{d(x)}$$

and testing to determine if adjacent locations are roots of $p_2(x)$, where:

$$p_2(x) = \frac{\sigma(\alpha*x)}{d(x)}.$$

The two polynomials $p_1(x)$ and $p_2(x)$, respectively, contain the non-common factors of $\sigma(x)$ and $\sigma(\alpha*x)$, and both are degree e−d=p, where d is the degree of the greatest common divisor, which is equal to the number of common factors.

The degree p of $p_1(x)$ and $p_2(x)$ is the number of solid bursts. There is generally a relatively small number of solid bursts, and thus, the degree of $p_1(x)$ and $p_2(x)$ is relatively low. Accordingly, known fast techniques for finding the roots of the lower-degree polynomial $p_1(x)$ can be used to determine the first locations of the solid bursts and adjacent error locations are tested as roots of $p_2(x)$. Thus, the system need not use the more time consuming methods that would be required if it had, also, to find the d common roots.

BRIEF DESCRIPTION OF THE DRAWINGS

For a fuller understanding of the nature and objects of the invention, reference should be had to the following detailed description taken in connection with the accompanying drawings, in which.

DESCRIPTION OF THE PREFERRED EMBODIMENT

The mathematical operations of addition, subtraction, multiplication and division discussed herein are Galois Field operations over the applicable Galois Field.

Figure 1:
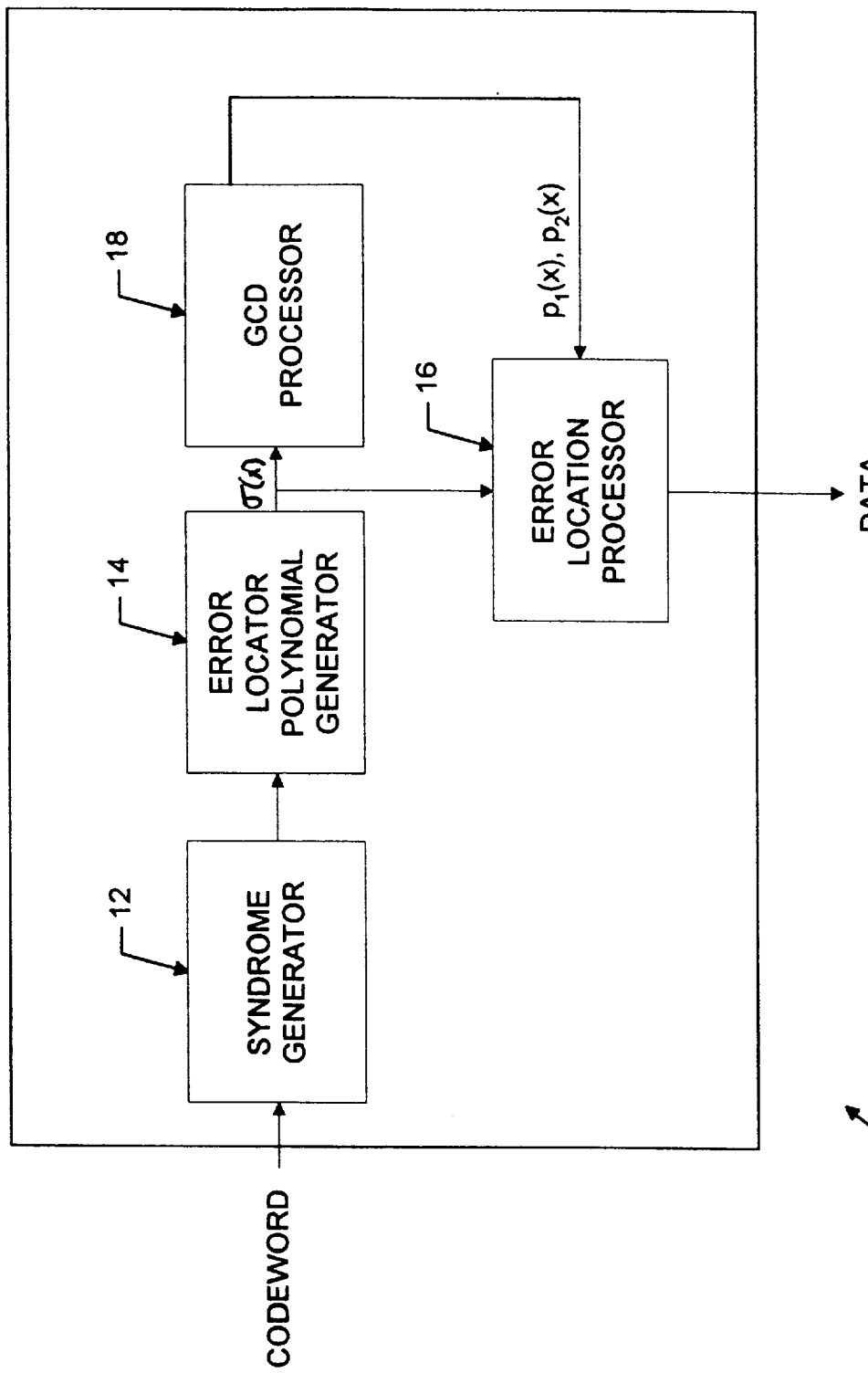
FIG. 1 is a functional block diagram of a decoder in the multiple-solid-burst error correcting system.

Referring now to FIG. 1, a decoder 10 includes a syndrome generator 12 that operates in a conventional manner to produce a set of error syndromes for a received code word. If the syndromes are all zero, the syndrome generator 12 determines that the code word is error-free. Otherwise, the syndrome generator sends the set of syndromes to an error locator polynomial generator 14, which produces in a conventional manner from the syndromes a degree "e" error locator polynomial, $\sigma(x)$:

$$\sigma(x)=\sigma_e x^e+\sigma_{e-1}x^{e-1}\ldots+\sigma_1 x+\sigma_0$$

where e is the number of errors in the code word.

The roots, $\sigma^{-i_k}$, of the error locator polynomial, and thus each factor of $\sigma(x)$, correspond to error locations $i_k$ in the code word.

Figure 2:
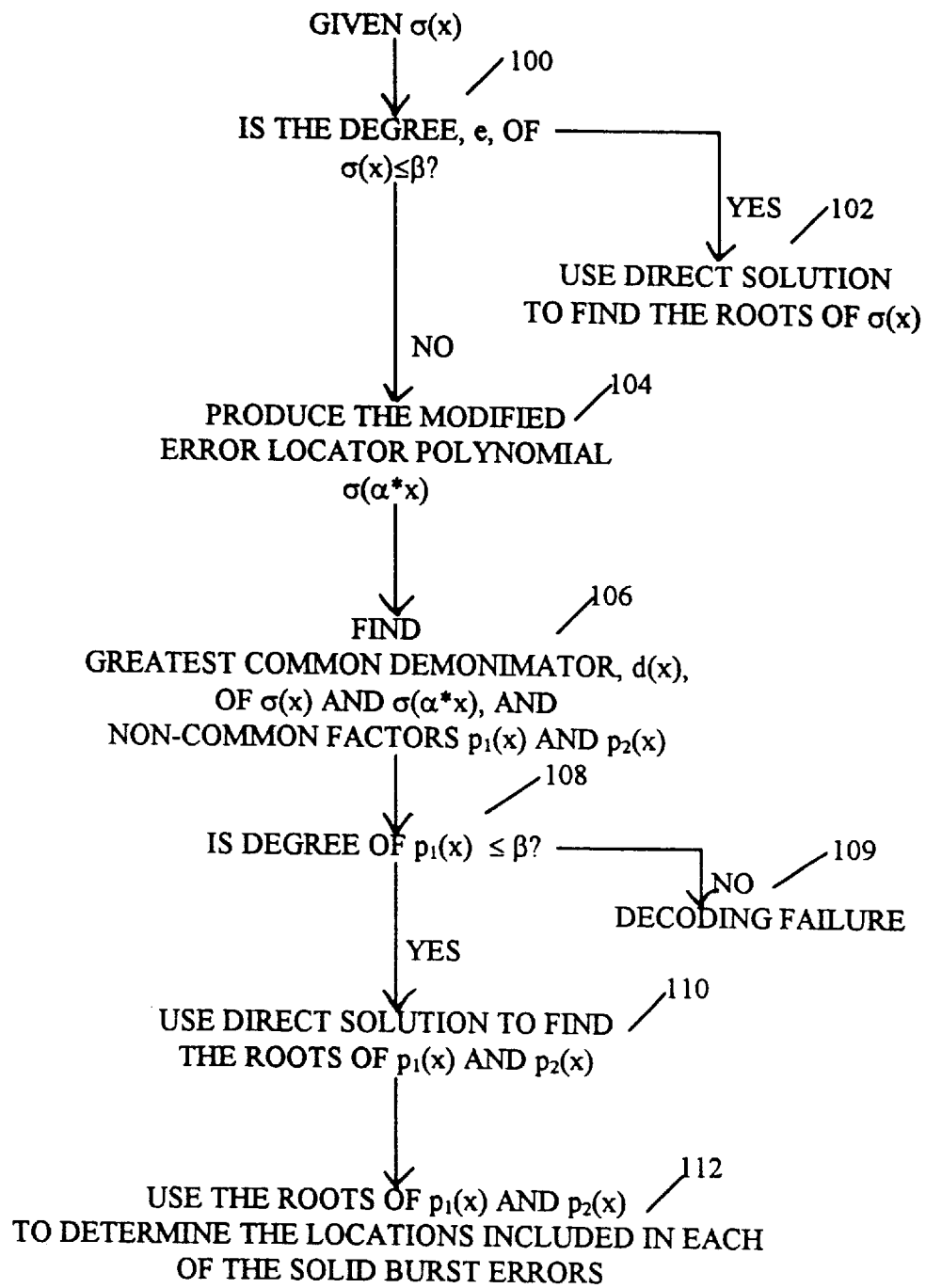
FIG. 2 is a flow chart of the operations of a GCD processor included in the system of FIG. 1.

Referring also to FIG. 2, the error locator polynomial generator 14 determines if $e \leq \beta$, where $\beta$ is a predetermined number of errors that can be corrected using a direct solution, that is, can be corrected in hardware {step 100}. If so, the error locator polynomial generator 14 sends the error locator polynomial to an error locator processor 16, which selects and implements an appropriate direct solution process for determining the e roots of the error locator polynomial {step 102}. For example, if e = 3, the error locator processor 16 implements a process for determining the roots of a degree-three polynomial.

Figure 3:
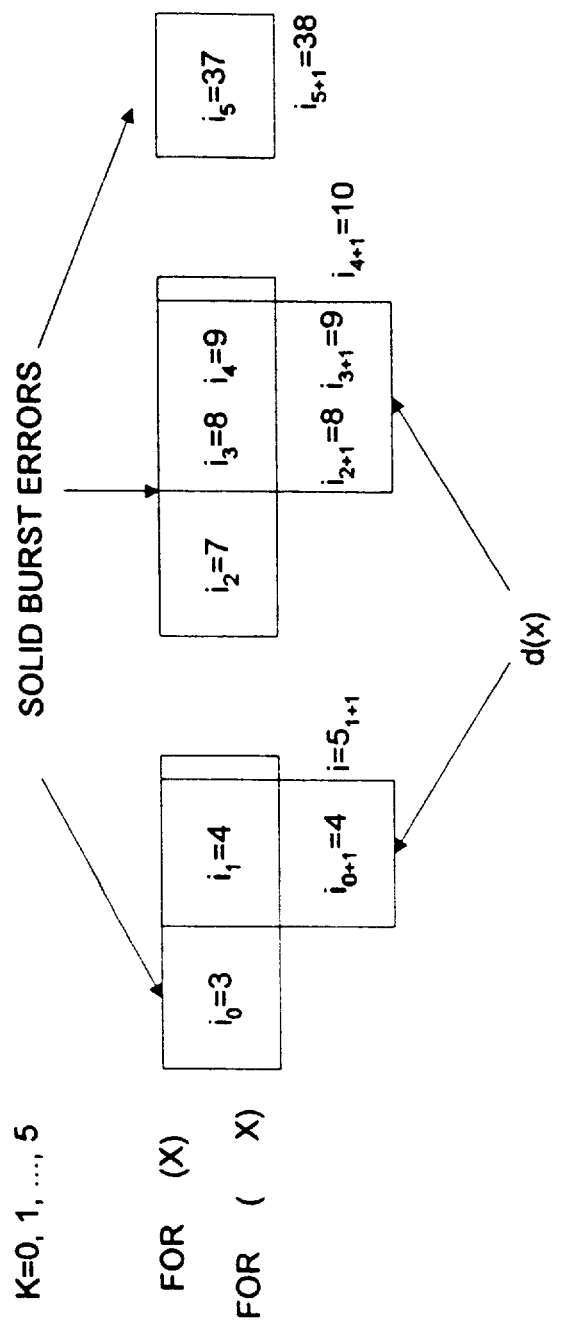
FIG. 3 is a chart that illustrates solid bursts and a greatest common divisor.

If e>$\beta$, the error locator polynomial generator 14 sends the error locator polynomial to a GCD processor 18, which produces a mapping error locator polynomial, $\sigma(\alpha*x)$, that maps the roots, $\alpha^{-i_k}$ of the error locator polynomial $\sigma(x)$ to $\alpha^{-(i_k+1)}$, where the addition of the exponents is modulo the code length n {step 104}. The mapping error locator polynomial $\sigma(\alpha*x)$ thus has roots that correspond to code word locations that are shifted one symbol from, or are adjacent to, the error locations determined by $\sigma(x)$, as depicted in FIG. 3.

The GCD processor 18 next determines the degree "d" greatest common divisor, $d(x)$, of $\sigma(x)$ and $\sigma(\alpha*x)$.{step 106}. The d common roots indicate error locations that are part of the solid bursts, since they correspond to adjacent error locations. The e−d=p roots, $\alpha^{-i_k}$, of the error locator polynomial $\sigma(x)$ that are not common with those of the mapping error locator polynomial $\sigma(\alpha*x)$ correspond, respectively, to the first locations of the solid bursts. The p roots $\alpha^{-(i_j+1)}$ of the mapping error locator polynomial $\sigma(\alpha*x)$ that are not common with those of the error locator polynomial $\sigma(x)$ correspond, respectively, to locations that are one location beyond the last locations of the solid bursts. Thus, the system determines the first and last locations of each solid burst from the non-common roots, and labels as erroneous all of the symbols that are in between the associated first and last symbols.

To find the error locations, the system determines the first locations of the respective solid bursts by finding the roots $\alpha^{-i_k}$ of the degree-p polynomial $p_1(x)$ which consists of the non-common factors of $\sigma(x)$. Next, the system, for each root of $p_1(x)$, tests adjacent locations $\alpha^{-(i_k+1)}, \alpha^{-(i_k+2)} \ldots$ as roots of $p_2(x)$ to find the end location of the associated solid burst. The system can do this much faster than it can find the roots of a higher degree polynomial by a similar trial and error technique. Further, the system need not find the roots of the d common factors, since these roots correspond to the locations between the various associated first and last locations.

The GCD processor 18 produces the mapping error locator polynomial $\sigma(\alpha^*x)$ from the error locator polynomial:

$$\sigma(x)=\sigma_e x^e+\sigma_{e-1}x^{e-1}+\ldots+\sigma_1 x+\sigma_0$$

by multiplying the coefficients $\sigma_j$ by $\alpha^j$.

$$\sigma(\alpha^*x)=\sigma_e \alpha^e x^e+\sigma_{e-1}\alpha^{e-1}x^{e-1}\ldots+\sigma_1\alpha x+\sigma_0\alpha^0$$

The resulting polynomial is the mapping error locator polynomial, which maps $\alpha^{-i_k}$ to $\alpha^{-(i_k+1)}$.

The GCD processor 18 uses a novel, iterative operation based on the Euclidean Algorithm to determine a greatest common divisor, $d(x)$, as discussed below with reference to FIG. 5. The iterative operation determines not only $d(x)$, but also the two polynomials $p_1(x)$ and $p_2(x)$ where $$p_1(x)=\frac{\sigma(x)}{d(x)} \text{ and } p_2(x)=\frac{\sigma(a^*x)}{d(x)}.$$

Once the GCD processor 18 determines $d(x)$, $p_1(x)$ and $p_2(x)$, the processor determines if the degree, p, of $p_1(X)$, which corresponds to the number of solid bursts, is less than or equal to $\beta$, to determine if the roots of $p_1(x)$ can be found using a direct solution {step 108}. If so, the GCD processor sends the polynomial $p_1(x)$ to the error location processor 16, which directly and quickly determines the p roots using known techniques for finding the roots of a degree-p polynomial {step 110}.

If $p>\beta$, it means that the system cannot use a direct solution technique to find the error locations and the system must use other, necessarily slower, techniques to find the error locations {step 112}.

As discussed above, every location in a solid burst contains an erroneous symbol. An error location that has only adjacent error-free symbols is a solid burst error of length 1. The degree, d, of the greatest common divisor, $d(x)$, is thus equal to $$d=b_1+b_2+b_3+\ldots+b_p-p$$

Where $b_m$ is the length of the $m^{th}$ solid burst error. Accordingly, if there are one or more long burst errors, the degree of $p_1(x)$, which is e−d=p, is relatively small. Recall that e is he degree of $\sigma(x)$, or the total number of erroneous symbols in the codeword.

Once the roots $\alpha^{-i_k}$ of the degree-p polynomial $p_1(x)$ have been determined, the error locator processor 16 determines which error locations are contained in the p solid bursts. The processor labels the locations that correspond to the roots $\alpha^{-i_k}$ of $p_1(x)$, respectively, as the first locations of the solid bursts and for each burst tests the consecutive roots $\alpha^{-(i_k+1)}$, $\alpha^{-(i_k+2)}$, ... until a root $\alpha^{31\ (i_j+1)}$ of $p_2(x)$ is found. The system then labels the location $i_j$ as the last location of the solid burst and the locations in between $i_k$ and $i_j$ as part of the same solid burst. The system repeats this for all the roots of $p_1(x)$. {step 112}. In contrast, prior error correction systems must determine all e roots of the error locator polynomial in order to determine the error locations.

Figure 4:
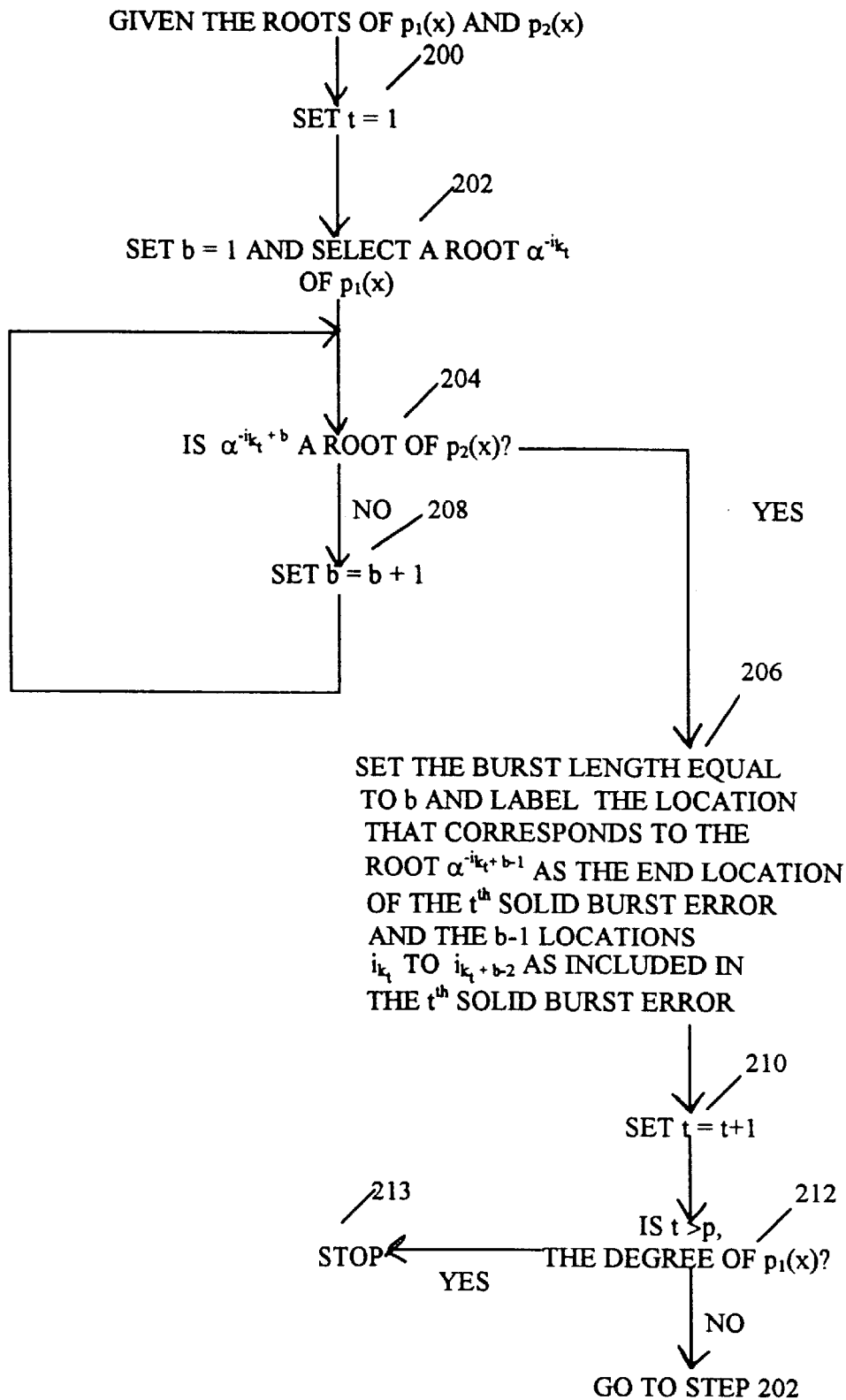
FIG. 4 is a more detailed flow chart of the operations of an error locator processor of FIG. 1 in determining the locations contained within respective solid bursts.

Referring now to FIG. 4, the error locator processor 16 selects a first root $\alpha^{-i_{kt}}$ of $p_1(x)$, where t=1 is the number of the solid burst. The processor sets "b," the burst error length, to b=1 and determines if $\alpha^{-(i_kt+b)}$ is a root of $p_2(x)$ {step 204}. If so, the error locator processor determines that the first burst error has a length of b=1, and thus, an end location that corresponds to $\alpha^{-(i_{kt}+b-1)}$ or to $\alpha^{-i_{kt}}$ {step 206}. Otherwise, the processor sets b=b+1 and again determines if $\alpha^{-(i_{kt}+b)}$ is a root of $p_2(x)$ {step 208}. The processor repeats these operations until it finds a root of $p_2(x)$. The processor then determines that the location, $i_{k_t+b}-1$, which corresponds to $\alpha^{-(i_kt+b-1)}$ is the end location of the $t^{th}$ solid burst error. The processor next labels the b locations $i_{k_t}$ to $i_{k_t}^{+b-1}$ as part of the $t^{th}$ solid burst error {step 206}.

Setting t=t+1, the error location processor 14 determines if t>p {steps 210, 212}. If not, the processor repeats steps 202–208 to determine the first and last locations of the next solid burst error, and labels those locations and the locations between them as part of the solid burst. The processor then repeats steps 202–212 until t exceeds p, which is the number of solid bursts errors in the code word {steps 212–213}.

Figure 5A:
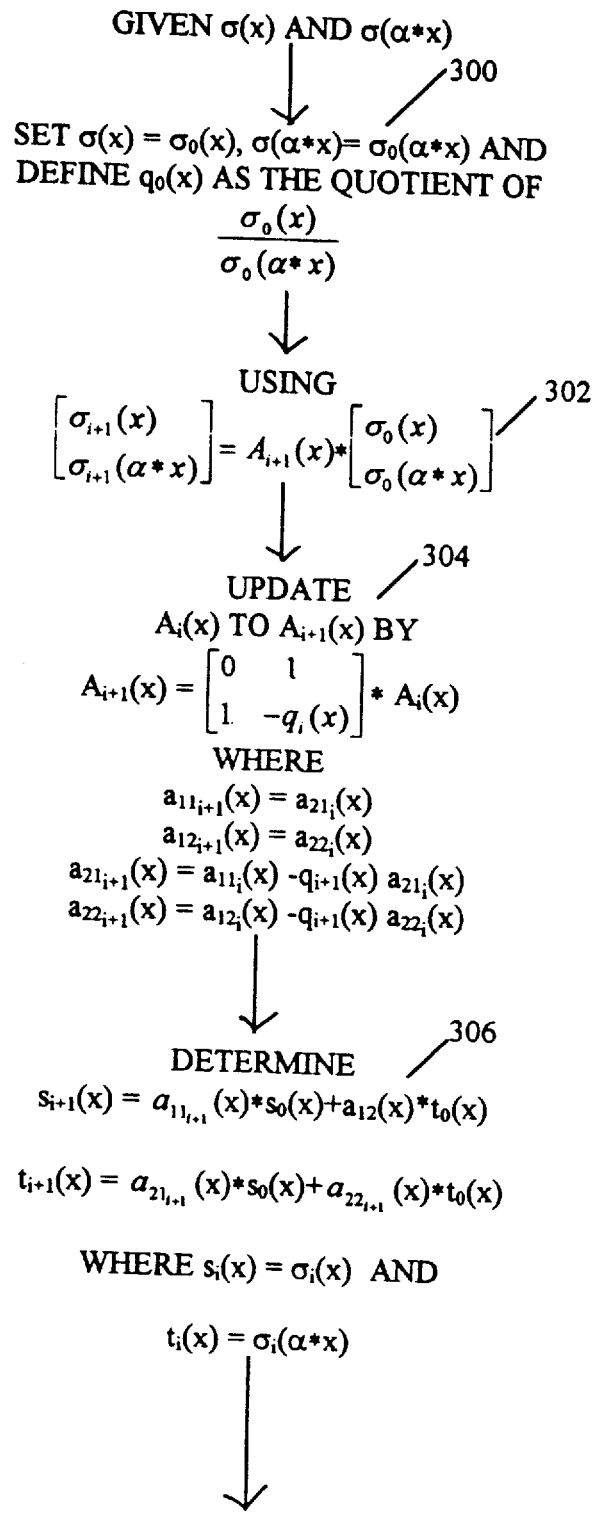
FIGS. 5A and 5B a are more detailed flow chart of the operations of the GCD processor in determining a greatest common divisor.
Figure 5B:
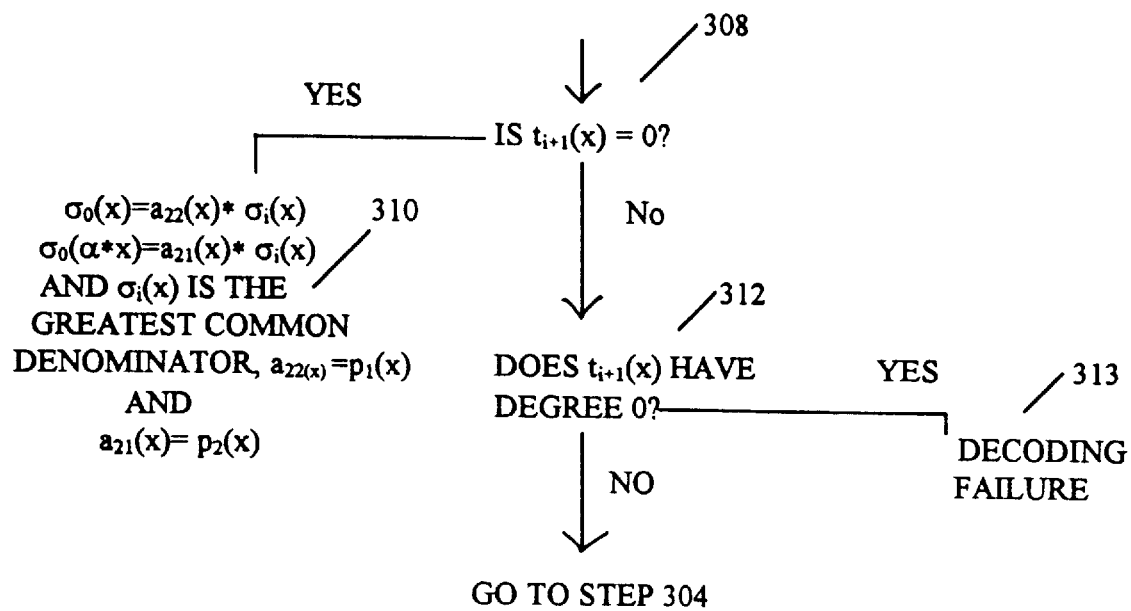

Referring now to FIG. 5, the operations of the GCD processor 18 in determining the greatest common divisor of $\sigma(x)$ and $\sigma(\alpha^*x)$ are discussed. The GCD processor 18 iteratively implements the Euclidean Algorithm, to relatively quickly determine the greatest common divisor, $d(x)$.

The Euclidean Division Algorithm states that for any two polynomials $s(x)$ and $t(x)$, with the degree of $t(x)$ less than or equal to that of $s(x)$:

$$s(x)=q(x)^*t(x)+r(x) \qquad [\text{eqn. 3}]$$

where $q(x)$ is the quotient of $$\frac{s(x)}{t(x)},$$

and $r(x)$ is the remainder, with the degree of $r(x)$ less than that of $t(x)$.

If $d(x)$ is a common divisor of $s(x)$ and $t(x)$, $d(x)$ also divides $s(x)-q(x)t(x)$, that is, $d(x)$ divides the remainder $r(x)$. Thus, $d(x)$ can be recursively determined from the known $s(x)$ and $t(x)$.

Let $s_o(x)=s(x)$ and $t_o(x)=t(x)$ and $q_i(x)$ be defined as the quotient of $s_i(x)$ and $t_i(x)$. Equation 3 then becomes:

$$s_i(x)=q_i(x)^*t_i(x)+t_{i+1}(x) \qquad [\text{eqn. 4}]$$

for i>0. For i>0, the degree of $s_i(x)$ is greater than the degree of $t_i(x)$ and the degree of $t_i(x)$ is greater than the degree of $t_{i+1}(x)$. To make equation 4 recursive, let $$s_{i+1}(x)=t_i(x) \qquad [\text{eqn. 5}]$$

and $$s_{i+1}(x)=q_{i+1}(x)^*\ t_{i+1}(x)+t_{i+2}(x) \qquad [\text{eqn. 6}]$$

where the degree of $t_{i+1}(x)$ is greater than the degree of $t_{i+2}(x)$. The degree of $t_i(x)$ thus monotonically decreases as i increases.

When the remainder $t_{n+1}(x)=0$, it implies that $s_{n+1}(x)=t_n(x)$ is one of the greatest common divisors of $s(x)$ and $t(x)$. In Galois Fields, there are a plurality of greatest common divisors. However, each greatest common divisor differs from another greatest common divisor by a constant non-zero factor, c, over the Galois Field. Thus all the greatest common divisors are of the form $c_j^*t_n(x)$.

By convention, a polynomial of the form $w(x)=p_k x^k+p_{k-1}x^{k-1}\ldots+b$ has degree k; a polynomial $w(x)=px+b$ has degree 1, and a polynomial $w(x)=b$ has degree 0. Also by convention, a polynomial $w(x)=0$ has degree $-\infty$.

The iteration of equation 6 continues until the degree of $t_{n+1}(x)$ equals either 0 or $-\infty$. If $t_{n+1}(x)$ has degree 0, $s_0(x)$ and $t_0(x)$ are relatively prime, i.e., they have no non-trivial common factors of degree 1 or higher. If $\sigma(x)=s_0(x)$ and $\sigma(\alpha^*x)=t_0(x)=t_0(x)$, $\sigma(x)$ and $\sigma(\alpha^*x)$ are relatively prime, and every solid burst error has length 1. There are thus too many errors for the ECC to correct using a direct solution, since the degree p of $p_1(x)$ is equal to e and $e>\beta$.

If the degree of $t_{n+1}(x)$ is $-\infty$, i.e., $t_{n+1}(x)=0$, all of the greatest common divisors of $s(x)$ and $t(x)$ have the form $c_j^* t_n(x)$. There are thus two lower-degree polynomials $p_1(x)$ and $p_2(x)$ that consist of the non-common factors of $\sigma(x)$ and $\sigma(\alpha^*x)$.

To recursively solve for the greatest common divisor, equations 5 and 6 are used, where $\sigma(x)=s_0(x)$ and $\sigma(\alpha^*x)=t_0(x)$ $i=0,1\ldots$ $$t_i(x) = s_{i+1}(x) \quad \text{[eqn. 5]}$$

$$s_i(x) = q_{i+1}(x)^* s_{i+1}(x) + t_{i+1}(x) \quad \text{[eqn. 6]}$$

In matrix form these equations are $$\begin{bmatrix} s_i(x) \\ t_i(x) \end{bmatrix} = \begin{bmatrix} q_i(x) & 1 \\ 1 & 0 \end{bmatrix} \begin{bmatrix} s_{i+1}(x) \\ t_{i+1}(x) \end{bmatrix} \quad \text{[eqn. 7]}$$

for $i \geq 0$. The two-by-two matrix of eqn 7 is non-singular for any $q_i(x)$. Thus the inverse of the matrix can be determined:

$$\begin{bmatrix} q_i(x) & 1 \\ 1 & 0 \end{bmatrix}^{-1} = \begin{bmatrix} 0 & 1 \\ 1 & -q_i(x) \end{bmatrix} \quad \text{[eqn. 8]}$$

Therefore $$\begin{bmatrix} s_{i+1}(x) \\ t_{i+1}(x) \end{bmatrix} = \begin{bmatrix} 0 & 1 \\ 1 & -q_i(x) \end{bmatrix} \begin{bmatrix} s_i(x) \\ t_i(x) \end{bmatrix}$$

and $$\begin{bmatrix} s_{i+2}(x) \\ t_{i+2}(x) \end{bmatrix} = \begin{bmatrix} 0 & 1 \\ 1 & -q_i(x) \end{bmatrix} \begin{bmatrix} s_{i+1}(x) \\ t_{i+1}(x) \end{bmatrix} = \begin{bmatrix} 0 & 1 \\ 1 & -q_i(x) \end{bmatrix} \begin{bmatrix} 0 & 1 \\ 1 & -q_1(x) \end{bmatrix} \begin{bmatrix} s_i(x) \\ t_i(x) \end{bmatrix}$$

The product of the two 2-by-2 matrices is by definition another 2-by-2 matrix. Accordingly, any $s_i(x), t_i(x)$ pair, $i \geq 0$, is related to $s(x)=s_0(x)$ and $t(x)=t_0(x)$ by a 2-by-2 matrix. This 2-by-2 matrix can be obtained iteratively using the Euclidean Algorithm.

If we define $A_0(x) = \begin{bmatrix} 1 & 0 \\ 0 & 1 \end{bmatrix}$ then $A_1(x) = \begin{bmatrix} 0 & 1 \\ 1 & -q_i(x) \end{bmatrix} * A_0(x)$ and $A_{i+1}(x) = \begin{bmatrix} 0 & 1 \\ 1 & -q_i(x) \end{bmatrix} * A_i(x)$ for $i \geq 0$.

The determinant of $$A_i(x)_1 \begin{vmatrix} 0 & 1 \\ 1 & -q_i(x) \end{vmatrix},$$

is $-1$ for all i. Accordingly, for even i's, $|A_i|=+1$ and for odd i's $|A_i|=-1$.

Then, by induction $$\begin{bmatrix} s_{i+1}(x) \\ t_{i+1}(x) \end{bmatrix} = A_{i+1}(x) * \begin{bmatrix} s_0(x) \\ t_0(x) \end{bmatrix} \quad \text{[eqn. 9]}$$

The matrix $A_i(x)$ can be re-written $$\begin{bmatrix} a_{11_i}(x) & a_{12_i}(x) \\ a_{21_i}(x) & a_{22_i}(x) \end{bmatrix}$$

and equation 9 can be re-written:

$$\begin{bmatrix} s_{i+1}(x) \\ t_{i+1}(x) \end{bmatrix} = \begin{bmatrix} a_{11_{i+1}}(x) & a_{12_{i+1}}(x) \\ a_{21_{i+1}}(x) & a_{22_{i+1}}(x) \end{bmatrix} \begin{bmatrix} s_0(x) \\ t_0(x) \end{bmatrix} \quad \text{and}$$

$$s_{i+1}(x) = a_{11_{i+1}}(x) s_0(x) + a_{12_{i+1}}(x) t_0(x)$$

$$t_{i+1}(x) = a_{21_{i+1}}(x) s_0(x) + a_{22_{i+1}}(x) t_0(x).$$

As discussed above, $A_i(x)$ is updated to $A_{i+1}(x)$ in accordance with the Euclidean Algorithm:

$$A_{i+1}(x) = \begin{bmatrix} 0 & 1 \\ 1 & -q_i(x) \end{bmatrix} * A_i(x)$$

Thus $\begin{bmatrix} a_{11_{i+1}}(x) & a_{12_{i+1}}(x) \\ a_{21_{i+1}}(x) & a_{22_{i+1}}(x) \end{bmatrix} = \begin{bmatrix} a_{11_i}(x) & a_{12_i}(x) \\ a_{21_i}(x) & a_{22_i}(x) \end{bmatrix} \begin{bmatrix} 0 & 1 \\ 1 & -q_{i+1}(x) \end{bmatrix}$ and to update, the GCD processor 18 renames $$a_{11_{i+1}}(x) = a_{21_i}(x)$$

$$a_{12_{i+1}}(x) = a_{22_i}(x)$$

and sets $$a_{21_{i+1}}(x) = a_{11_i}(x) - q_{i+1}(x) a_{21_i}(x)$$

$$a_{22_{i+1}}(x) = a_{12_i}(x) - q_{i+1}(x) a_{22_i}(x)$$

Then the GCD processor continues updating until either $t_{i+1}(x)=0$, that is, has degree $-\infty$, or $t_{i+1}(x)$ has degree 0.

The inverse of $A_i(x)$ is $$A_i(x)^{-1} = c_j * \begin{bmatrix} a_{22_i}(x) & -a_{12_i}(x) \\ -a_{21_i}(x) & a_{11_i}(x) \end{bmatrix}$$

where $j=i$ and $c_j$ equals $-1$ for odd j's and $+1$ for even j's. In $GF(2^M)$, $c_j=1$ for all values of j.

Thus $$\begin{bmatrix} s_0(x) \\ t_0(x) \end{bmatrix} = \begin{bmatrix} a_{22_{i+1}}(x) & -a_{12_{i+1}}(x) \\ -a_{21_{i+1}}(x) & a_{11_{i+1}}(x) \end{bmatrix} \begin{bmatrix} s_{i+1}(x) \\ t_{i+1}(x) \end{bmatrix} \quad \text{[eqn. 10]}$$

If $t_{i+1}(x)$ has degree $-\infty$, that is, if $t_{i+1}(x)=0$, equation 10 becomes:

$$\begin{bmatrix} s_0(x) \\ t_0(x) \end{bmatrix} = \begin{bmatrix} a_{22_{i+1}}(x) & a_{12_{i+1}}(x) \\ a_{21_{i+1}}(x) & a_{11_{i+1}}(x) \end{bmatrix} \begin{bmatrix} s_{i+1}(x) \\ 0 \end{bmatrix}$$

-continued and $$s_0(x) = \sigma(x) = a_{22_{i+1}}(x) * s_{i+1}(x)$$

$$t_0(x) = \sigma(\alpha^*x) = a_{21_{i+1}}(x) * s_{i+1}(x)$$

The greatest common divisors are thus of the form $c_j^* s_{i+1}(x)$, which is the same as $c_j^* t_i(x)$. {steps 300+310 }. Since $\sigma(x) = s_0(x)$ and $\sigma(\alpha^*x) = t_0(x)$, the term $a_{22_i} + 1$ (x) consists of all the factors of $\sigma(x)$ that are not common with $\sigma(\alpha^*x)$, and $a_{21_{i+1}}(x)$ consists of all the factors of $\sigma(\alpha^*x)$ that are not common with $\sigma(x)$. Thus, $p_1(x) = a_{22_{i+1}}(x)$ and $p_2(x) = a_{21_{i+1}}(x)$. Further, $a_{22_{i+1}}(x)$ consists of the factors with roots that correspond, respectively, to the first locations of the solid bursts and $a_{21_{i+1}}(x)$ consists of the factors with roots that correspond, respectively, to locations that are one location beyond the last locations of the solid bursts.

As discussed above, the error locator processor associates a last location with a first location and labels these locations and all the locations in between them as erroneous and part of the same solid burst error. The system can thus quickly correct up to $\beta$ solid burst errors of any length, since all of the locations included in the burst errors contain erroneous symbols.

Once the system has determined the error locations, the system then uses conventional methods to determine the error values. The system thereafter uses the error values associated with the error locations included in the solid bursts, to correct the erroneous symbols.

What is claimed is:

1. An error correcting system for correcting multiple solid burst errors including:

A. a syndrome generator processor for producing error syndromes for a received code word;

B. an error locator polynomial generator processor for producing an error locator polynomial, $\sigma(x)$, from the error syndromes;

C. a greatest common divisor processor for
  a. producing a mapping error locator polynomial, $\sigma(\alpha^*x)$, that maps roots, $\alpha^{-i_k}$, of the error locator polynomial to $\alpha^{-(i_k+1)}$, and
  b. determining a greatest common divisor, $d(x)$, of the error locator polynomial and the mapping error locator polynomial, and two polynomials $p_1(x)$ and $p_2(x)$ that, respectively, consist of the non-common factors of the error locator polynomial and the mapping error locator polynomial; and D. an error locator processor for
  a. determining the roots, $\alpha^{-i_k}$, of $p_1(x)$ and the roots, $\alpha^{-(i_j+1)}$, of $p_2(x)$,
  b. labeling the locations $i_k$ that correspond to the roots of $p_1(x)$ as the first locations in the respective solid bursts and the locations $i_j$ that are one location away from the locations $i_j+1$ that correspond to the roots of $p_2(x)$ as the last locations of the respective solid bursts,
  c. determining that all locations between an associated first location and last location as part of an associated solid burst, and
  d. correcting the symbols contained in the locations that are included in the respective solid bursts.

2. The error correcting system of claim 1 wherein the greatest common divisor processor includes:

i. means for determining $$\begin{bmatrix} \sigma(x) \\ \sigma(\alpha^*x) \end{bmatrix} = A_{i+1}(x) * \begin{bmatrix} s_{i+1}(x) \\ t_{i+1}(\alpha^*x) \end{bmatrix}$$

ii. means for updating $A_{i+1}(x)$, $s_i(x)$ and $t_i(\alpha^*x)$, iii. means for determining that $t_i(\alpha^*x)$ is the greatest common divisor if $t_{i+1}(\alpha^*x) = 0$; and iv. means for determining that $\sigma(x)$ and $\sigma(\alpha^*x)$ are relatively prime if $t_{i+1}(\alpha^*x)$ has degree zero.

3. The error correcting system of claim 2 wherein the greatest common divisor processor includes means for updating $$A_i(x) = \begin{bmatrix} a_{11_i}(x) & a_{12_i}(x) \\ a_{21_i}(x) & a_{22_i}(x) \end{bmatrix} \text{ to } A_{i+1}(x)$$

by setting:

$$a_{11_{i+1}}(x) = a_{21_i}(x)$$

$$a_{12_{i+1}}(x) = a_{22_i}(x)$$

$$a_{21_{i+1}}(x) = a_{11_i}(x) - q_{i+1}(x)a_{21_i}(x)$$

$$a_{22_{i+1}}(x) = a_{12_i}(x) - q_{i+1}(x)a_{22_i}(x)$$

where $q_{i+1}(x)$ is the quotient of $$\frac{s_{i+1}(x)}{t_{i+1}(\alpha^*x)}.$$

4. The error correcting system of claim 3 wherein $p_1(x) = a_{22_{i+1}}(x)$ and $p_2(x) = a_{21_{i+1}}(x)$.

5. The error correcting system of claim 4 wherein the error locator processor finds the roots of $p_1(x)$ and for each root $\alpha^{-i_k}$ tries $\alpha^{-(i_k+1)}, \alpha^{-(i_k+2)} \ldots$ as roots of $p_2(x)$ until a root of $p_2(x)$ is found, the error locator processor labeling the location $i_k$ that corresponds to the root $\alpha^{-i_k}$ of $p_1(x)$ as the starting location of the solid burst and labeling the location $i_j$ that corresponds to one location away from the root $\alpha^{-(i_j+1)}$ of $p_2(x)$ as the end location of the solid burst.

6. A method for determining solid bursts in a received code word including the steps of:

A. producing error syndromes for a received code word;

B. producing an error locator polynomial, $\sigma(x)$, of degree e from the error syndromes if the error syndromes are non-zero;

C. producing a mapping error locator polynomial, $\sigma(\alpha^*x)$, that maps roots, $\alpha^{-i_k}$, of the error locator polynomial to $\alpha^{-(i_k+1)}$;

D. determining a greatest common divisor, $d(x)$, of the error locator polynomial and mapping the error locator polynomial, and two polynomials $p_1(x)$ and $p_2(x)$ that, respectively, consist of the non-common factors of the error locator polynomial and the mapping error locator polynomial;

E. determining the roots, $\alpha^{-i_k}$, of $p_1(x)$ and the roots, $\alpha^{-(i_k+1)}$, of $p_2(x)$, and
  i. labeling the locations $i_k$ that correspond to the roots of $p_1(x)$ as the first locations in the respective solid bursts and the locations $i_{j+1}$ that are one location away from the locations $i_j+1$ that correspond to the roots of $p_2(x)$ as the last locations of the respective solid bursts, and
  ii. labeling all locations between an associated first and last location as part of an associated solid burst.

7. The method of claim 6 further including the steps of:
   a. determining if the degree e of the error locator polynomial is less than or equal to a predetermined number of errors; and
   b. if so, using a direct solution for a degree-e polynomial to determine the locations of the errors in the code word.

8. The method of claim 6 further including the steps of:
   a. determining
   $$\begin{bmatrix} \sigma(x) \\ \sigma(\alpha^*x) \end{bmatrix} = A_{i+1}(x)^* \begin{bmatrix} s_{i+1}(x) \\ t_{i+1}(x) \end{bmatrix}$$
   b. iteratively updating $A_{i+1}(x)$, $s_i(x)$ and $t_i(x)$
   c. determining that $t_i(x)$ is the greatest common denominator if $t_{i+1}(x)=0$; and
   d. determining that $\sigma(x)$ and $\sigma(x)$ are relatively prime if $t_{i+1}(\alpha^*x)$ has degree zero.

9. The method of claim 8 further including in the step of updating $A_{i+1}(x)$, $\sigma(x)$ and $\sigma(\alpha^*x)$, the steps of i. updating $A_{i+1}(x)$ from $A_i(x)=$
   $$A_i(x) = \begin{bmatrix} a_{11_i}(x) & a_{12_i}(x) \\ a_{21_i}(x) & a_{22_i}(x) \end{bmatrix}$$
   by setting
   $$a_{11_{i+1}}(x) = a_{21_i}(x)$$
   $$a_{12_{i+1}}(x) = a_{22_i}(x)$$
   $$a_{21_{i+1}}(x) = a_{11_i}(x) - q_{i+1}(x)a_{21_i}(x)$$
   $$a_{22_{i+1}}(x) = a_{12_i}(x) - q_{i+1}(x)a_{22_i}(x),$$
   where $q_{i+1}(x)$ is the quotient of $\dfrac{s_{i+1}(x)}{t_{i+1}(x)}$ .

\* \* \* \* \*